CIRCUIT BOARD STRUCTURE WITH INTERCONNECTING MEANS

Filed Jan. 14, 1966

INVENTOR
John Anthony Cayzer

BY John E. Vandigriff
ATTORNEY

INVENTOR
John Anthony Cayzer

BY John E. Vandigriff
ATTORNEY

United States Patent Office 3,437,882

Patented Apr. 8, 1969

3,437,882

CIRCUIT BOARD STRUCTURE WITH INTERCONNECTING MEANS

John Anthony Cayzer, Brickhill, England, assignor to Texas Instruments Incorporated, Dallas, Tex., a corporation of Delaware Filed Jan. 14, 1966, Ser. No. 520,595

Int. Cl. H02b *1/04*

U.S. Cl. 317—101 2 Claims

ABSTRACT OF THE DISCLOSURE

Interconnected circuit board assemblies are disclosed each comprising a first circuit board having a plurality of apertures therein and a plurality of second circuit boards with interconnecting electrical circuit members attached thereto, projecting beyond one edge thereof, and secured through said apertures to conductive members on said first circuit board. The interconnecting electrical circuit members provide mechanical rigidity to an entire assembly, electrical conductivity between the circuit modules and ease of connection and disconnection of the different boards for repair and change of connections.

This invention relates to the interconnection of circuit boards and more particularly to the interconnection of circuit boards having packaged circuits mounted thereon.

In order to interconnect circuit boards, it is necessary to provide one or more circuit boards with edge connectors in the form of male coupling conductors which may engage socket connectors provided on the face of another circuit board so that the first circuit boards extend perpendicular to the face of the second board. The use of such plug and socket type connectors permits connection and disconnection of the circuit boards, but has several disadvantages. Two disadvantages are the possibility of high contact resistance between the individual plug and socket connections, even when gold plated plug and sockets are used, and insufficient mechanical rigidity of the interconnection in certain applications.

It is therefore an object of this invention to provide means for interconnecting circuit boards.

It is another object of the invention to provide an interconnection for circuit boards which forms a rigid mechanical and electrical connection between the boards.

Still another object of the invention is to provide interconnections between circuit boards which may be disconnected for repair and subsequently reconnected without replacement of the connector assembly.

Other objects and features of the invention will be apparent from the following detailed description when read in conjunction with the appended claims and attached drawings in which:

Figures 1, 2, 3:
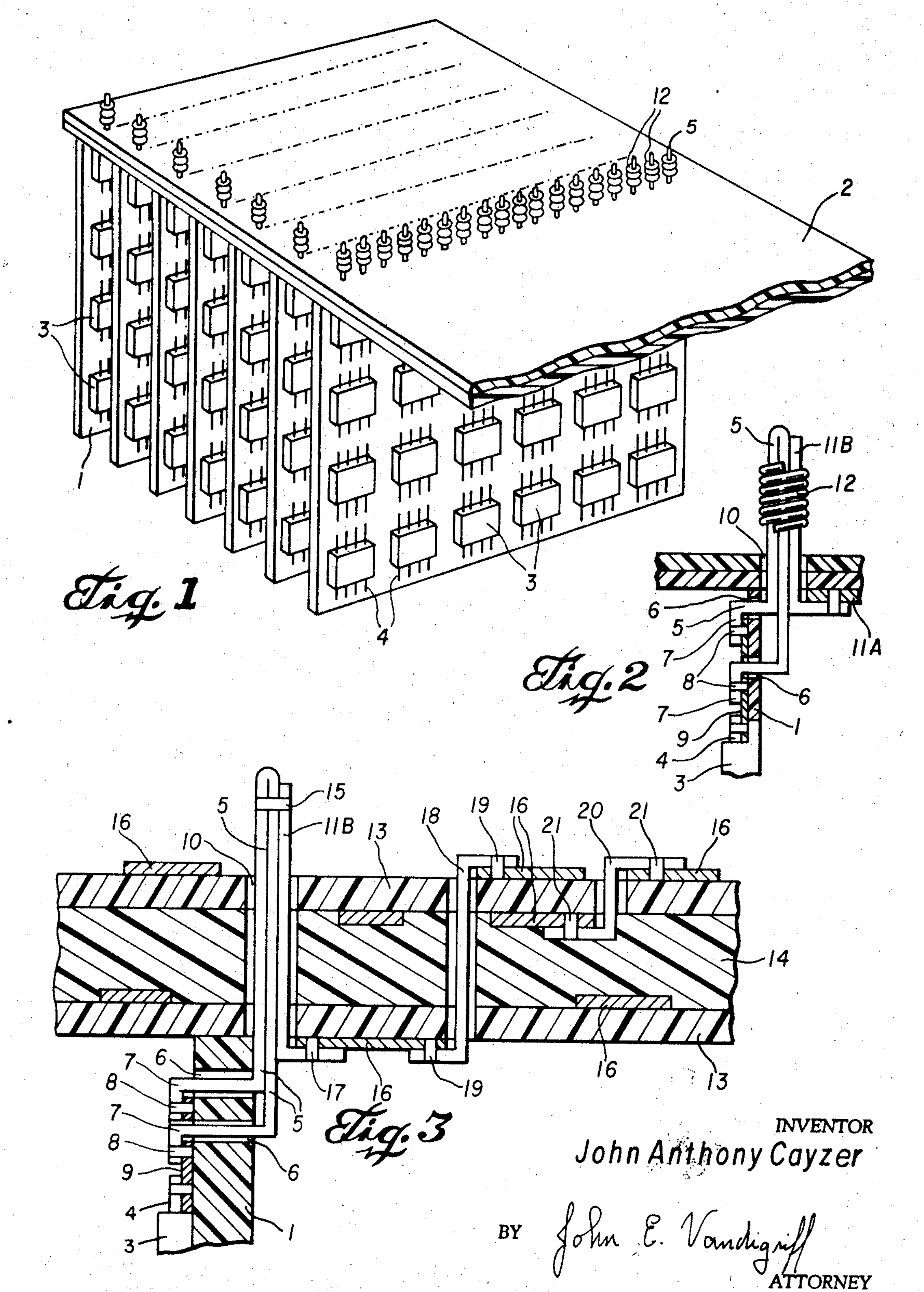
FIGURE 1 is an isometric view of electrical circuit boards interconnected according to the invention.
FIGURE 2 is a cross-sectional view of a part of FIGURE 1 showing in greater detail the interconnection between the two circuit boards.
FIGURE 3 is a cross-sectional view of an alternate form of interconnection and showing an alternate form of circuit board construction.

FIGURE 1 shows several circuit boards 1 interconnected with a circuit board 2. The boards 1 extend parallel to one another and perpendicular to one face of the board 2. The circuit boards 1 each has circuit packages 3 mounted thereon by welding their lead wires 4 to suitable conductors formed on the circuit boards 1 as, for example, by printed circuit techniques.

Each circuit board 1 has electrical conductor pins 5 projecting beyond one edge thereof, each pin 5 being bonded to one of the electrical conductors formed on the circuit board. FIGURE 2 shows such a conductor pin 5 in more detail. The pin 5 comprises a wire folded back on itself and extending adjacent one face of the board 1, each end portion of the wire being bent at right angles to the main length of the wire, the bent portions extending through the respective apertures 6 in the board 1, and then bent again to extend parallel to the main length of the wire forming tabs 7. These tabs are bonded by, for example, weld 8 to a printed circuit conductor 9 on the opposite face of the board 1 which is connected to a lead wire 4 on one of the circuit packages 3.

As shown in FIGURES 1 and 2, each pin 5 extends through an aperture 10 of the circuit board 2 so that the edge of the board 1 abuts the underface of the board 2. Printed circuit conductors 11A on the underface of the board 2 terminate adjacent each aperture 10 and have welded thereto respective electrically conductive pins 11B bent to extend through the aperture 10 so that they are upstanding from the upper face of board 2 in contact with the pin 5 also extending through the aperture.

To establish a secure mechanical joint between contacting pins 5 and 11B, the pins are secured by a wire wrapped joint 12, this joint also bringing the pins 5 and 11B into secure intimate electrical connection.

By similarly joining the other pins 5 of the circuit boards 1 with the adjacent pins 11B of the circuit boards 2, the boards 1 and 2 may be securely interconnected by the joints 12 which provide secure mechanical connections as well as reliable electrical connections having low electrical resistance. The circuit packages 3 on the boards 1 can thus be interconnected with one another and with electrical terminations by the formation of suitable conductor patterns, which may include circuit elements (not shown) mounted on board 2. In the event of failure of any circuit package 3, or the need for the replacement of a circuit board 1 for any reason, the joints 12 may be unwrapped without difficulty. The circuit board 1 concerned can then be removed and replaced with another board, the wrapped joint 12 then being formed again by the use of a suitable wire wrapping tool. The construction thereby provides secure mechanical and effective electrical interconnection between the circuit boards 1 and 2 while permitting replacement of boards 1 with no difficulty.

FIGURE 3 is a cross-sectional view showing an alternate form of interconnection to the wire wrapped joint 12 shown in FIGURE 1. FIGURE 3 also illustrates the use of a circuit board comprising a pair of double sided printed circuit boards 13 separated and bonded by an epoxy resin filler 14. The circuit board 1 has folded wire pins 5 as before, each having a pair of tabs 7 bonded for example, by weld 8 to a printed circuit conductor 9 extending from a lead wire 4 of a circuit package 3. The portion of the pin 5 projecting from the edge of circuit board 1 extends through aperture 10 in the circuit board 2 in contact with a conductor pin 11B. As thus far described, the interconnection is similar to that shown in FIGURE 2.

The pins 5 and 11B are secured to each other to provide a secured mechanical and electrical joint between them by a weld 15, for example, located adjacent to ends of the pins 5 and 11B. A circuit board 1 can be removed from the circuit board 2 by severing the pins 5 and 11B below the weld 15. Interconnection between the pins 5 of a replacement circuit board 1 and the severed pins 11B can readily be affected by making a new weld between pins 5 and 11B adjacent the severed ends of the pins.

It should be noted from the FIGURE 3 that the circuit boards 13 have printed circuit conductors 16 formed on opposite faces thereof. The pin 11B shown has a tabbed portion bonded to one such conductor 16 on the outer surface of the lower board 13 by weld 17 and that another conductor 16 is interconnected with a conductor 16 on the outer surface of the upper circuit board 13 by lead through conductor 18 having end tabs bonded to each of the conductors 16 by welds 19. In addition there are other conductors 16 on opposite faces of the upper circuit board 13 interconnected by lead through conductor 20 secured to these conductors 16 by welds 21.

Figures 4, 5, 6:
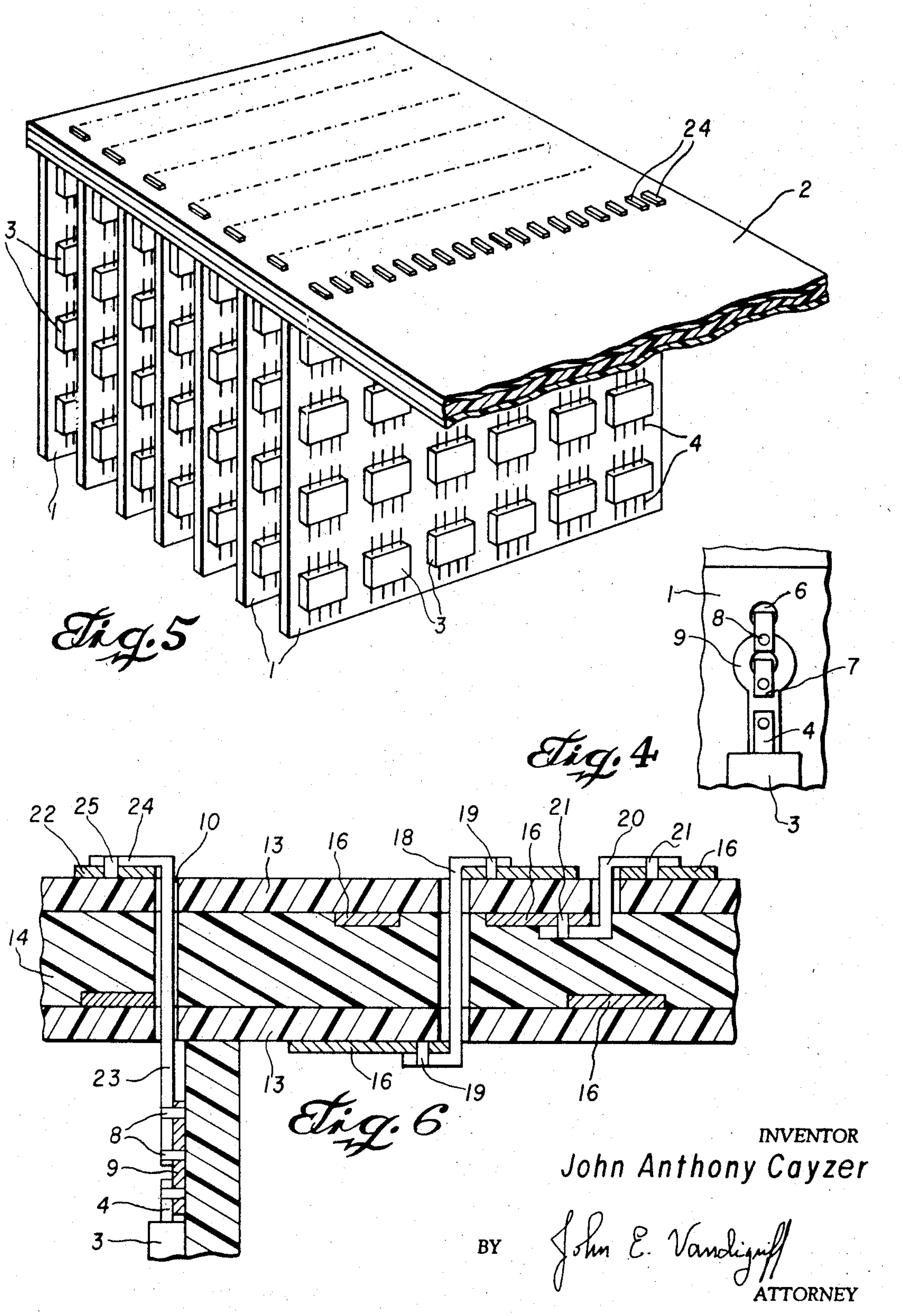
FIGURE 4 is a partial view of one of the interconnections fastened to one of the circuit boards.
FIGURE 5 is an isometric view of electrical circuit boards interconnected in accordance with another embodiment of the invention.
FIGURE 6 is a cross-sectional view of a portion of FIGURE 5 showing interconnection between the two circuit boards in greater detail.

FIGURES 5 and 6 shows interconnected circuit boards 1 and 2 of the type shown in FIGURES 3 and 4 in which the pins 5 and 11B are not upstanding from the surface of the upper circuit board 13, as shown in FIGURE 6. Instead the pin 11B is replaced by circuit conductor 22 formed on and extending along the top surface of the upper circuit board 13. Pin 5 is replaced by a single wire 23 projecting beyond one edge of the circuit board 1, extending through an aperture 10 in the circuit board 2. The end portion of wire 23 is bent over to form a tab 24 extending along the top surface of the upper circuit board 13 and overlying the conductor 22. The conductors 22 and 23 are secured by a weld 25 located adjacent the ends of the tab portion 24. This permits removal of the circuit board 1 by severing the tab portion 24 between the weld 25 and the aperture 10. Subsequent connection of the replacement circuit board 1 is affected by making a new weld at the end of the tab portion of 24, suitably shortened to join the conductors 22 and 23.

FIGURE 4 illustrates how the end 7 of the wire pin 5 may be extended through the circuit board 1 and welded to the circuit conductor 9 on the board 1.

Although the present invention has been shown and illustrated in terms of specific preferred embodiments, it will be apparent that changes and modifications are possible without departing from the spirit and scope of the invention as defined in the appended claims.

What is claimed is:

1. An interconnected circuit board assembly comprising in combination, a first circuit board having a plurality of apertures therein and first conductor members attached thereto, and a plurality of second circuit boards disposed perpendicularly from said first circuit board and having interconnecting electrical circuit members attached thereto and projecting beyond one edge thereof, said interconnecting electrical circuit members extending through said apertures in said first circuit board and secured to said first conductor members to effect an electrical and mechanical connection thereto,
   wherein said interconnecting electrical circuit members attached to said second circuit boards extend through the apertures in said first circuit board and are attached to said first conductor members on the opposite side of said first circuit board, and
   wherein each of said interconnecting electrical circuit members are attached to said second circuit board and doubled back upon itself having two ends extending through two apertures in one side of said second circuit board and attached to the other side of said second circuit board.

2. An interconnected circuit board assembly comprising in combination, a first circuit board having a plurality of apertures therein and a plurality of first circuit conductor members secured to at least one side thereof, a plurality of second circuit boards having circuit conductors and packaged circuits attached thereto, a plurality of interconnecting circuit members attached to each of said second circuit boards and projecting beyond one edge thereof, each of said interconnecting circuit members extending through one of said apertures in said first circuit board and secured to one of said first circuit conductor members to hold each of said second circuit boards in an abutting relation with said first circuit board to provide good electrical and mechanical connection between said first circuit board and said second circuit boards,
   wherein each of said apertures has one of said first circuit conductor members extending therethrough, secured to one side of said first circuit board and attached to said interconnecting circuit member extending through each of said apertures, and
   wherein said first circuit conductor member and said interconnecting circuit member are welded together on the side of said first circuit board opposite to that side to which said first circuit conductor member is secured.

References Cited

UNITED STATES PATENTS

| | | | |
|---|---|---|---|
| 2,929,965 | 3/1960 | Oden | 317—101 |
| 3,083,261 | 3/1963 | Francis et al. | 317—101 |
| 3,216,089 | 11/1965 | Dettman | 317—101 |
| 3,281,627 | 10/1966 | Fetterolf et al. | 317—101 |
| 3,290,557 | 12/1966 | Ayer | 317—101 |
| 2,876,390 | 3/1959 | Sanders | 317—101 |
| 3,233,034 | 2/1966 | Grabbe | 174—68.5 |
| 2,876,390 | 3/1959 | Sanders | 317—101 |
| 2,929,965 | 3/1960 | Oden | 317—101 |
| 3,083,261 | 3/1963 | Francis et al. | 317—101 |
| 3,216,089 | 11/1965 | Dettman | 317—101 |
| 3,233,034 | 2/1966 | Grabbe | 174 68.5 |
| 3,281,627 | 10/1966 | Fetterolf et al. | 317—101 |
| 3,290,557 | 12/1966 | Ayer | 317—101 |

LEWIS T. MYERS, *Primary Examiner.*

J. R. SCOTT, *Assistant Examiner.*

U.S. Cl. X.R.

174—68.5